United States Patent [19]

Hiwatashi

[11] Patent Number: 4,910,680

[45] Date of Patent: Mar. 20, 1990

[54] WIRING METHOD FOR SEMICONDUCTOR INTEGRATED CIRCUIT

[75] Inventor: Tamotsu Hiwatashi, Yokohama, Japan

[73] Assignee: Kabushiki Kaisha Toshiba, Kawasaki, Japan

[21] Appl. No.: 173,462

[22] Filed: Mar. 25, 1988

[30] Foreign Application Priority Data

Mar. 26, 1987 [JP] Japan .................................. 62-70368

[51] Int. Cl.⁴ ............................................ G06F 15/60
[52] U.S. Cl. .................................... 364/491; 364/490; 364/489; 364/488
[58] Field of Search ................. 364/488, 489, 490, 491

[56] References Cited

U.S. PATENT DOCUMENTS

| | | | |
|---|---|---|---|
| 4,593,351 | 6/1986 | Hong et al. | 364/200 |
| 4,593,362 | 6/1986 | Bergeron et al. | 364/488 |
| 4,600,995 | 7/1986 | Kinoshita | 364/491 |
| 4,613,941 | 9/1986 | Smith et al. | 364/489 |
| 4,811,237 | 3/1989 | Putatunda et al. | 364/491 |
| 4,815,003 | 3/1989 | Putatunda et al. | 364/491 |

OTHER PUBLICATIONS

"A New Two-Dimensional Routing Algorithim" by Chi-Ping Hsu, IEEE 19th Design Automation Conference, 1982, pp. 46-50.
Proceeding of ISCAS 85, pp. 29-30, "A New Routing Region Definition and Ordering Scheme Using L-Shaped Channels"; W. Dai et al.; 1985.

Primary Examiner—Parshotam S. Lall
Assistant Examiner—V. N. Trans
Attorney, Agent, or Firm—Oblon, Spivak, McClelland, Maier & Neustadt

[57] ABSTRACT

There is disclosed a computer-aided automatic wiring method for a semi-custom logic LSI having input/output circuit blocks arranged in the peripheral portion of a chip substrate and function blocks arranged in a substrate surface region surrounded by the input/output circuit blocks and selected to provide a desired logic function. Channels functioning as wiring regions are defined around the function blocks to include internal channels positioned between the function blocks and peripheral channels arranged in direct contact with the input/output circuit blocks. The internal channels are sequentially subjected to the wiring process according to the limitation of a predetermined processing order. After the wiring process for the internal channels is completed, the peripheral channels are merged to form a square ring-form channel region. Then, the square ring-form channel region is unidimensionally developed to form a belt-like channel region. The wiring process for the belt-like channel region is effected, and a wiring pattern resultantly obtained for the belt-like channel region is reformed to be suited to the square ring-form channel region, thus completing the wiring pattern for the peripheral channels.

10 Claims, 6 Drawing Sheets

WIRING METHOD FOR SEMICONDUCTOR INTEGRATED CIRCUIT

BACKGROUND OF THE INVENTION

1. Field of the Invention

This invention relates to an automatic wiring method for semi-custom semiconductor integrated circuit devices, and more particularly to an automatic wiring method of constructing, on a chip substrate, wiring paths between function blocks which are selected to realize desired LSI circuit function on the chip substrate according to a predetermined routing scheme under the computer-assisted control.

2. Description of the Related Art

Unlike full-custom LSIs (large scale integrated circuits), the semi-custom LSIs have gained in importance for the semiconductor manufactures because they can be developed in a relatively short period of time, and they are superior in flexibility for the use of various LSIs and low in the manufacturing cost. Building block type LSIs and general cell type LSIs are typical examples of semi-custom LSIs wherein selected function blocks (which are also called "modules"), such as a central processing unit (CPU), arithmetic logic unit (ALU), programmable logic array (PLA), random access memory (RAM), read only memory (ROM) or polycell unit, are dispersedly arranged on a semiconductor chip substrate. A properly designed wiring pattern having line segments (called trunks) extending in row and column directions (X and Y directions) is additionally provided in a substrate wiring region formed to surround the function blocks and defined therebetween in order to provide electrical wirings between the function blocks, thus attaining desired LSI functions.

In general, in this type of semi-custom LSI, a computer-aided design method is used to determine the wiring pattern for electrical connection between the function blocks. For example, when a channel wiring method is used for the wiring pattern design, the wiring region on the substrate surface is divided into subwiring regions (known as "channel" to those skilled in the art) so as to correspond to the function blocks arranged on the substrate. Since each of the function blocks is generally formed in a rectangular plane form, each of the sub-wiring regions or channels is formed in a rectangular plane form and arranged adjacent to a corresponding one of the function blocks. Therefore, adjacent channel regions on the substrate are place in contact with each other via a straight-line boundary. The number of wirings or tracks, which extend in the row and column directions and can be formed in each of the channels, is determined based on the surface area of the channel. In order to satisfy the condition of the number of tracks and reduce the length of the wiring to a minimum, the wiring pattern required for attaining desired LSI functions is independently determined for each channel.

For example, the design for the wiring pattern in a corresponding channel between a function block and other associated function blocks is made in a manner that terminals of the function block can be correctly connected to those of the other function blocks. In this case, each connection line is generally formed of lines extending in the row and column directions with the allowable track number taken into consideration. Row and column lines are respectively formed in two conductive layers which are electrically insulatively laminated. Connection at specified portions between the row and column lines is effected via contact holes formed in an insulative layer sandwiched between the two conductive layers. After the wiring pattern has been determined for one channel, the wiring pattern for another channel adjacent thereto is determined by the same process.

However, it is difficult to enhance the integration density of the semi-custom LSI finally obtained according to the conventional automatic wiring design method to a satisfactory degree. This is because dead space for wiring which is not used for the LSI wiring tends to remain in the wiring pattern of the channels finally obtained, making it difficult to effectively minimize the chip size. In particular, the dead space tends to be provided in regions in which the channels are intersected, that is, the long and short sides of the adjacent rectangular channels are in contact with each other. Increase in the dead space undesirably increases the chip size, lowering the LSI integration density.

SUMMARY OF THE INVENTION

It is therefore an object of the present invention to provide a new and improved automatic wiring method for semiconductor integrated devices which improves the utility factor of channels for wirings between function blocks, thus improving the integration density of the semiconductor integrated circuit devices.

In accordance with the above object, the present invention is addressed to a specific automatic wiring method which determines, under the computer assist, a wiring pattern for semiconductor integrated devices in which function blocks selected to provide desired logic functions are arranged in the surface area of a substrate surrounded by input/output circuit blocks provided on the peripheral portion of the substrate and channels functioning as wiring regions are formed around the function blocks. First, the channels are sequentially processed for wiring in a predetermined processing order; and a channel wiring pattern is obtained by determining electrical connecting paths between the function blocks associated with one of the channels selected at this time to satisfy the requirement for the wiring in the selected channel. After it is determined that the wiring process for internal channels (also known as "inner channels") among the channels except peripheral channels which are in direct contact with the input/output circuit blocks is completed, the peripheral channels (also known as "outer channels") are merged together to form a channel region of square ring form. Then, the channel region is developed in a one dimensional fashion to form a belt-like channel region. The wiring process is effected or performed for the belt-like channel region to determine a wiring pattern for the beltlike channel region, and then the wiring pattern is modified to be suitably used for the channel region of square ring form, thus completing the determination of the wiring pattern for the outer channels by a single wiring process.

The present invention, and its objects and advantages will become more apparent from the detailed description of a preferred embodiment presented below.

BRIEF DESCRIPTION OF THE DRAWINGS

In the detailed description of a preferred embodiment of the invention presented below, reference is made to the accompanying drawing of which.

DETAILED DESCRIPTION OF THE PREFERRED EMBODIMENT

Figure 1:
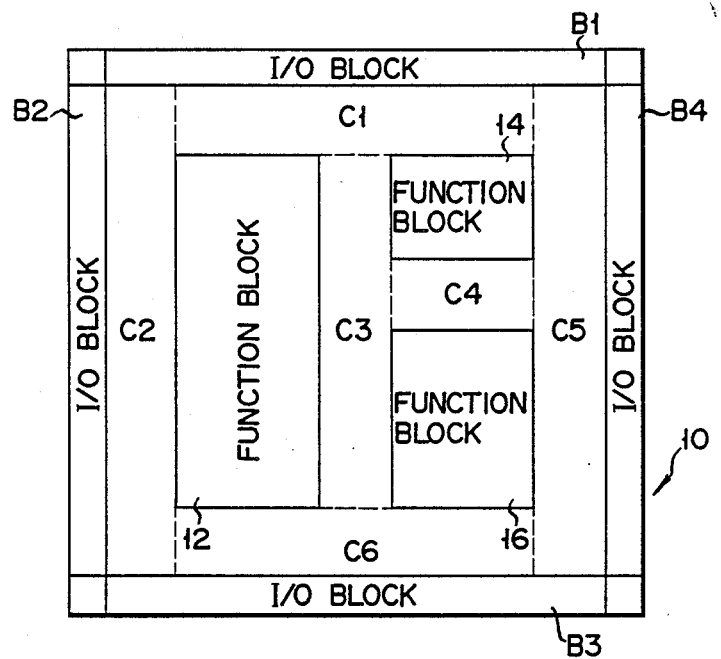
FIG. 1 is a diagram schematically shows the plan view of a building block type (or general cell type) semi-custom logic LSI in which a wiring region defined between function blocks arranged on a chip substrate is divided into a plurality of channels according to "channel wiring method"

Before describing the embodiment of this invention, the problem in the conventional wiring method is first explained so that this invention can be clearly and easily understood. In FIG. 1, the plan view of a typical example of building block type (which is also called "general cell type") logic LSI device is illustrated (for brief explanation, the number of function blocks is reduced to three). A semiconductor chip substrate is generally designated by reference numeral "10". The top surface of substrate 10 is divided into two areas a rectangular main circuit region located at the center thereof and an input/output circuit region formed at the peripheral portion of substrate 10 to surround the main circuit region. In the main circuit region, three function blocks 12, 14 and 16 are arranged, for example and in the input/output circuit region, four input/output circuit blocks (which are hereinafter referred to as "I/O blocks") B1, B2, B3 and B4 are arranged on four corners of substrate 10.

Function blocks 12, 14 and 16 are selected circuit blocks (which are also called "modules") which are necessary for providing desired LSI functions for customers and which may include a central processing unit (CPU), arithmetic logic unit (ALU), programmable logic array (PLA), random access memory (RAM) and/or read only memory (ROM), for example.

In the main circuit region surrounded by I/O blocks B1 to B4, that portion of the substrate surface region which remains around function blocks 14 and 16 is used as a wiring layer in which wirings are formed to provide electrical connections between the function blocks and between the function blocks and I/O blocks B1 to B4. That is, wirings extending in row and column directions (X and Y directions) are formed in the wiring region so as to provide desired LSI functions on chip substrate 10. In the case where "channel wiring method" is used as an automatic wiring method of designing the wiring pattern in the wiring region, the wiring region is divided into rectangular sub-wiring regions C1 to C6 in accordance with the arrangement of function blocks 12, 14 and 16. The sub-wiring regions are hereinafter referred to as "channels" according to the practice established in this technical field. Channels C1 to C6 are in contact with each other via horizontal or vertical boundaries (which are also called "envelops") as shown by broken lines in FIG. 1. The boundaries are defined by the known method of extending properly selected edge lines of each function block. When the wiring process is effected in each channel, the channel width can be changed smaller or larger according to the result of the wiring process in the corresponding channel. Therefore, the number of tracks (corresponding to the number of channels extending in the channel) can be determined in accordance with the number of wirings required for the channel.

Figure 2:
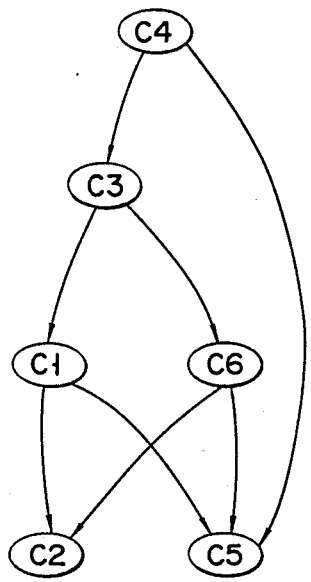
FIG. 2 is a diagram visually showing the priority order (limitation for the processing order) of the steps effected in the wiring process for the wiring between the channels divided in the LSI of FIG. 1, this diagram being known as a "channel order construction graph"

Channels C1 to C6 are sequentially subjected to a wiring process according to a predetermined processing order determined by the requirement for connections between function blocks 12, 14 and 16 and the limitation of the wiring process. More specifically, the priority processing order suitable for the wiring process for connections between channels C1 to C6 is first determined, and one of the channels which should be first processed to determine the wiring pattern is specified. As shown in FIG. 2, the processing order in which the channels are wiring-processed is determined based on the requirement for connections between function blocks 12, 4 and 16 and the limitation of the wiring process (the method of determining the order of wiring steps itself is known to those skilled in the art; for example, it is shown in FIG. 1 and a corresponding portion of the disclosure of U.S. Pat. application Ser. No. 026,301, filed on Mar. 16, 1987). In accordance with the order limitation diagram of FIG. 2, channel C4 is a channel to be first subjected to the wiring process, and after this, a channel to be subjected to the wiring process is determined according to arrows indicated in FIG. 2. In this case, the order of the wiring process for two channels indicated by two branched arrows can be freely determined. For example, after the completion of the wiring process for channel C3, either one of channels C1 and C6 can be next subjected to the wiring process. Also, after the completion of the wring process for channel C6, either one of channels C2 and C5 can be next subjected to the wiring process. In this example, the wiring process for the channels is effected in the order of C4→C3→C1→C6→C2→C5.

In the wiring region which is surrounded by four I/O blocks B1 to B4 arranged outside the periphery thereof and is divided into channels C1 to C6 as described above, when the channel wiring process is effected to satisfy the limitation of the processing order, the channel width is undesirably enlarged to provide dead space, raising a problem of increasing the chip size. The problem is caused by the fact that the short sides of peripheral channels (also known as "outer channels") C2 and C5 are in direct contact with I/O blocks B1 and B3.

Figure 3:
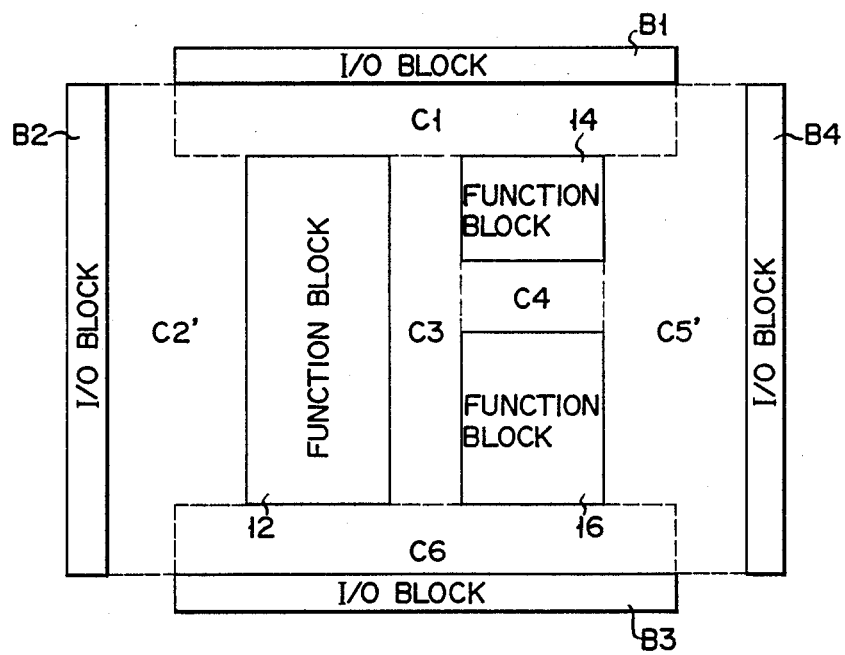
FIG. 3 is a diagram schematically showing the plan view of a semi-custom logic LSI having two opposite peripheral channels extended to perform the wiring between the two peripheral channels by the conventional automatic wiring process.

According to the limitation of the wiring process order shown in FIG. 2, channels C2 and C5 may be subjected to the wiring process after the completion of the wiring process for channels C1 and C6. Those of wirings added to channels C1 and C6 which extend to enter channel C2 or C5 appear on the short sides of channels C1 and C6. When channel C2 or C5 is subjected to the wiring process, the process for wiring between channel C2 or C5 and channels C1 and C6 in which the wiring process is completed cannot be effected within the rule of the routing scheme of "channel wiring method" because the short sides of channel C2 or C5 are in direct contact with I/O block 1 or B3. Therefore, it becomes necessary to expand channels C2 and C5 to have enlarged channel widths as shown in FIG. 3. This increases the chip size and lowers the integration density of the semiconductor device.

Figures 4A, 4B:
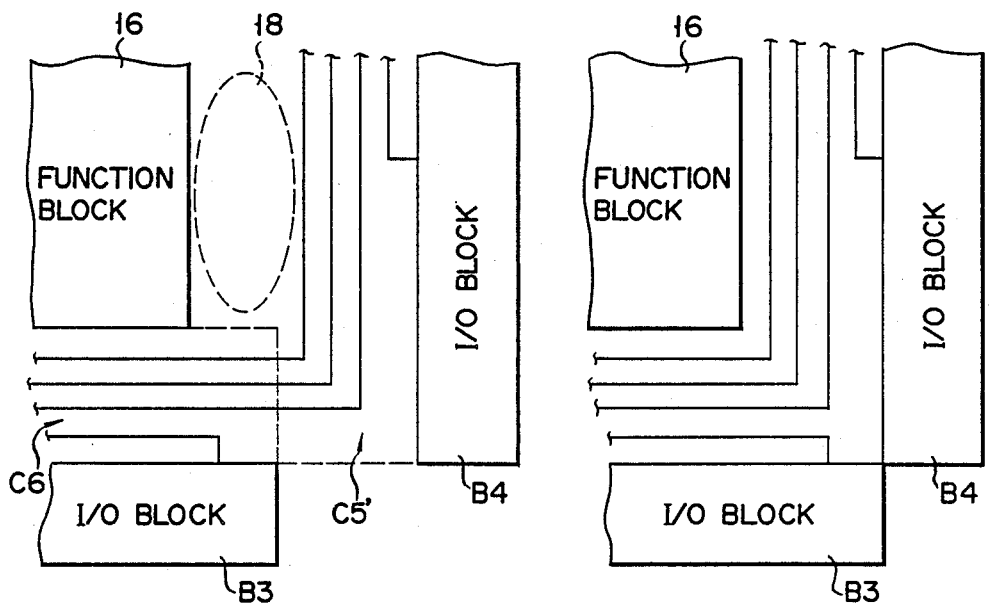
FIG. 4A is an enlarged diagram showing in more detail part of the wiring pattern located at a corner of the substrate of the logic LSI designed according to the conventional wiring method.
FIG. 4B is an enlarged diagram showing in more detail part of the wiring pattern located at a corner of the substrate of the logic LSI designed according to the wiring method of this invention.

In FIG. 4A, an enlarged wiring pattern at one corner of substrate 10 is illustrated in more detail. Three out of four horizontal wiring lines extending in channel C5 are connected to three vertical lines of expanded channel C5'. In order to achieve the connection between the wiring lines, channel C5' has been expanded to have an enlarged channel width, and as the result, dead space will be provided as indicated by reference numeral "18". Region 18 is dead space which cannot be used for the internal wiring pattern of the device, and is a main cause for lowering the integration density of the device.

The problems occurring in the conventional automatic wiring method as described above can be effectively solved by the wiring technique of the invention presented below.

In the case where function blocks 12, 14 and 16 are arranged in an area defined by four I/O blocks B1 to B4 on substrate 10 of a building block type semi-custom logic LSI as shown in FIG. 1, the wiring region of substrate 10 is divided into channels C1 to C6. The process is the same as that effected in the conventional channel wiring method described before. Therefore, the order of channels C1 to C6 to be subjected to the wiring process is determined according to the limitation of the processing order shown in FIG. 2. In the following description, channels C3 and C4, which are located in substantially the central area of the substrate surface and surrounded by function blocks 12, 14 and 16, are referred to as "internal channels"; and channels C1, C2, C5 and C6 which are located in the peripheral portion of the substrate surface so as to be in contact with I/O blocks B1 to B4 are referred to as "peripheral channels".

Figure 5B:
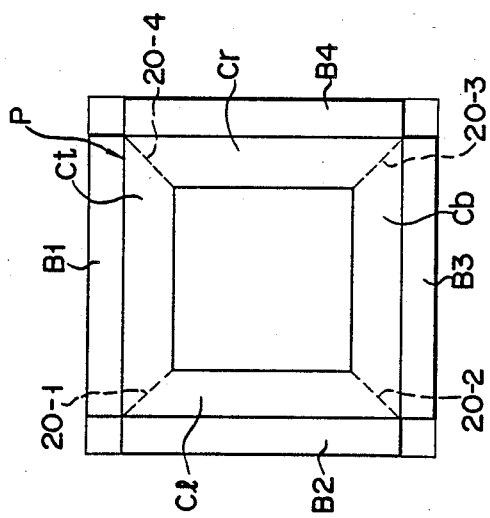
FIGS. 5A to 5C are diagrams showing the shapes of modeled channels obtained in the process of merging four peripheral channels on the chip substrate into a square ring-form channel region according to the wiring technique of this invention and one-dimensionally developing the square ring-form channel region into a belt-like channel region.
Figure 5A:
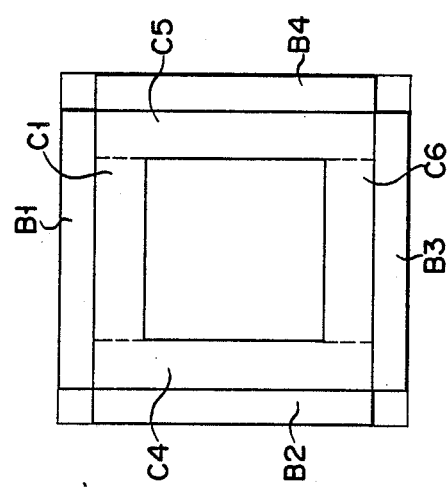
Figure 5C:
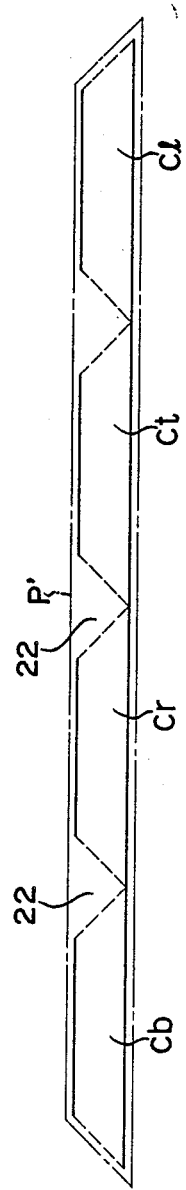

When one of the peripheral channels, or channel C1 in this embodiment, is subjected to the wiring process after the completion of the wiring process for internal channels C3 and C4, four peripheral channels C1, C2, C5 and C6 are combined together to form a single square closed loop or ring-form channel P. Next, square ring-form channel P is developed to form a one-dimensional long and narrow channel P'. The channel reforming step is shown in FIGS. 5A to 5C by use of models for easy understanding. The model diagram of FIG. 5A schematically shows the channels which are divided on the substrate and correspond to peripheral channels C1, C2, C5 and C6 shown in FIG. 1. As shown in FIG. 5B, peripheral channels C1, C2, C5 and C6 are merged into a single square ring-form channel P. Next, ring-form channel P is developed into belt-like channel P' as shown in FIG. 5C. Oblique boundaries (indicated by broken lines) 20-1, 20-2, 20-3 and 20-4 defined on the four corners of ring-form channel P of FIG. 5B correspond to "cut-off lines" used at the time of developing belt-like channel P. In FIG. 5B, four sub-channels located at top, bottom, left and right portions and divided by "cut-off lines" 20 in ring-form channel P are designated according to the positions thereof by symbols "Ct", "Cb", "Cl" and "Cr".

Data for the wiring process for belt-like channel P' thus obtained is formed; and the wiring process for belt-like channel P' is effected by substantially the same routing technique as the wiring processing technique for internal channels C3 and C4. In other words, the wiring processings for peripheral channels C1, C2, C5 and C6 are replaced by a single wiring processing for belt-like channel P' which is obtained by unidimensionally developing new ring-form channel P formed by merging the peripheral channels. The following respects are important in the channel merging and wiring process: when divided channels of the building block type or general cell type LSI are sequentially subjected to the wiring process according to the limitation of the priority order in the wiring processing of FIG. 2, the wiring process for the internal channels is first completed, and the wiring process for the peripheral channels in contact with the I/O blocks is delayed to the last. That is, the wiring process for internal channels C3 and C4 is generally completed before the operation of merging peripheral channels C1, C2, C5 and C6 into square ring form channel P is started. Therefore, the rearrangement step for the channels in the invention described above can be effected to meet the limitation of the priority processing order according to the basic processing flow of "channel wiring method".

Figure 6:
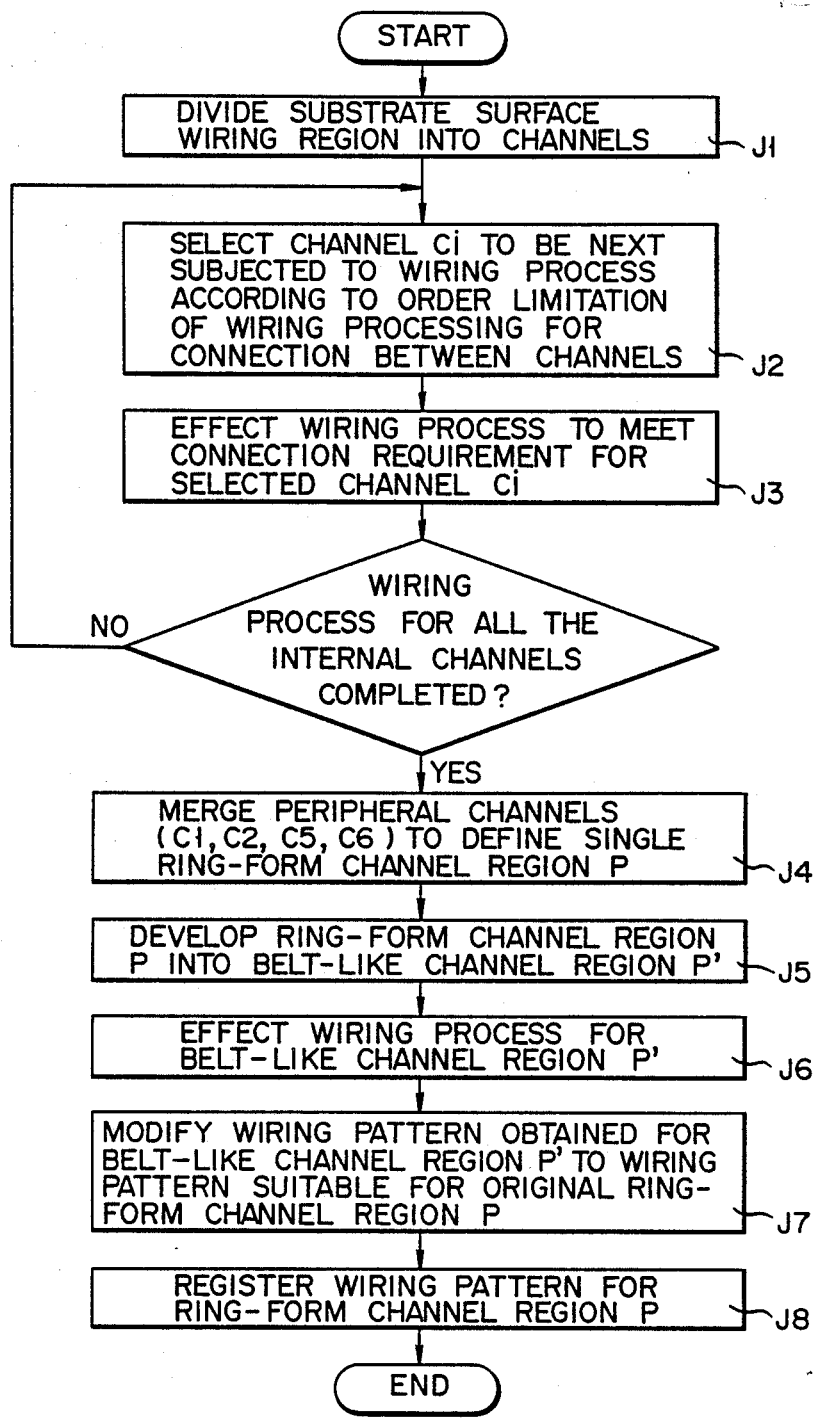
FIG. 6 is a flowchart showing the main steps in the automatic wiring method of this invention.

FIG. 6 is a flowchart schematically showing the wiring processing step for the channels according to the automatic wiring method of this invention. First, a wiring region between function blocks 12, 14 and 16 arranged in the surface area surrounded by I/O blocks B1 to B4 on chip substrate 10 shown in FIG. 10 is divided into channels C1 to C6 (step J1). Channel Ci to be next subjected to the wiring process is selected according to the limitation of the wiring processing order in "channel wiring method" from the divided channels (step J2), and then the wiring process for selected channel Ci is effected (step J3). At this point, whether the wiring process for all the internal channels (that is, C3 and C4) lying between function blocks 12, 14 and 16 is completed or not is checked. If, in this case, it is detected that there is a channel which is not yet subjected to the wiring process, the wiring process is fed back to step J2.

Steps J2 and J3 are repeatedly effected, and if it is detected that the wiring process for both channels C3 and C4 is completed, the wiring process for peripheral channels (that is, C1, C2, C5 and C6) according to the wiring processing technique of this invention is started. At this stage, the wiring process for connection between peripheral channels C1, C2, C5 and C6 and internal channels C3 and C4 which have been subjected to the wiring process is effected so as to complete the electrical connection between the function blocks and I/O blocks B1 to B4. At this processing stage, peripheral channels C1, C2, C5 and C6 are first merged into a single square ring-form channel region P (step J4). At this time, as shown in FIG. 5B, boundaries between peripheral channels C1, C2, C5 and C6 are changed to oblique lines (which are shown by broken lines 20-1, 20-2, 20-3 and 20-4 in FIG. 5B) connecting four corner edges of the internal wiring region including function blocks 12, 14 and 16 to four respective inner corner edges of I/O blocks B1 to B4. Square ring-form channel region P can be unidimensionally developed by cutting off sub-channels from each other along one of the boundaries (for example, boundary 20-2 between sub-channels Cl and Cb), thus forming belt-like channel region P' (step J5). As shown in FIG. 5C, belt-like channel region P' is constructed by sub-channels Cb, Cr, Ct and Cl of square ring-form channel region P at the top, bottom, left and right portions thereof which are arranged in a row with no space therebetween. Therefore, the upper side of belt-like channel region P' will be in contact with the function blocks and internal channels C3 and C4 and the lower side thereof will be in contact with I/O blocks B1 to B4.

After belt-like channel region P' has been subjected to the wiring process, a wiring pattern for completing the electrical connection between the function blocks and the I/O blocks can be obtained (step J6). In this step, parallel wirings extending in belt-like channel region P' in the lengthwise direction thereof are permitted to pass through auxiliary regions (which are shown by inverted triangle 22 in FIG. 5C and are added to belt-like channel region P' when square ring-form channel region P is unidimensionally developed) located between two adjacent subchannels (for example, Cb and Cr) in belt-like channel region P'. In other words, corresponding terminals arranged to satisfy the requirements for connection between the upper and lower sides of belt-like channel region P' can be freely connected with each other by use of vertical and horizontal line segments.

The wiring pattern for belt-like channel region P' determined by the method as described above can be modified to be suited to square ring-form channel region P (step J7). At this time, auxiliary regions 22 added to belt-like channel region P' are omitted; the wirings passing through the auxiliary regions become bending points at which the wirings are bett on the four oblique boundaries of square ring-form channel region P. The thus modified wiring pattern is registered as final wiring pattern data (step J8).

Figure 7D:
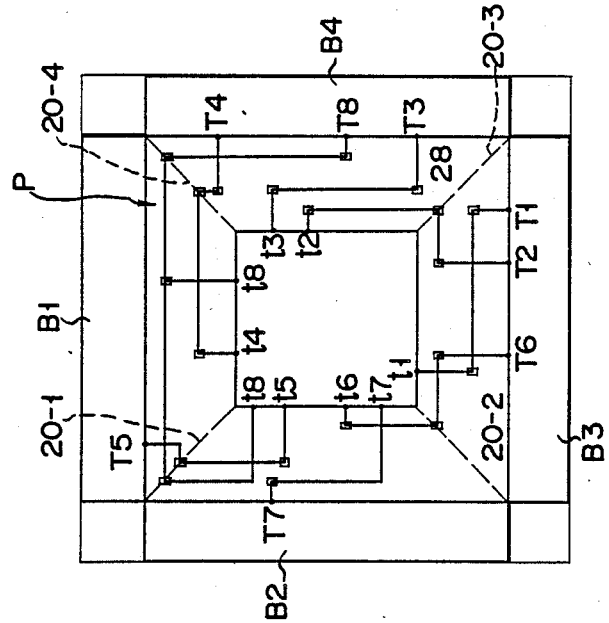
FIGS. 7A to 7D are diagrams showing an example of the wiring pattern actually wiring-processed according to the wiring technique of this invention.
Figure 7A:
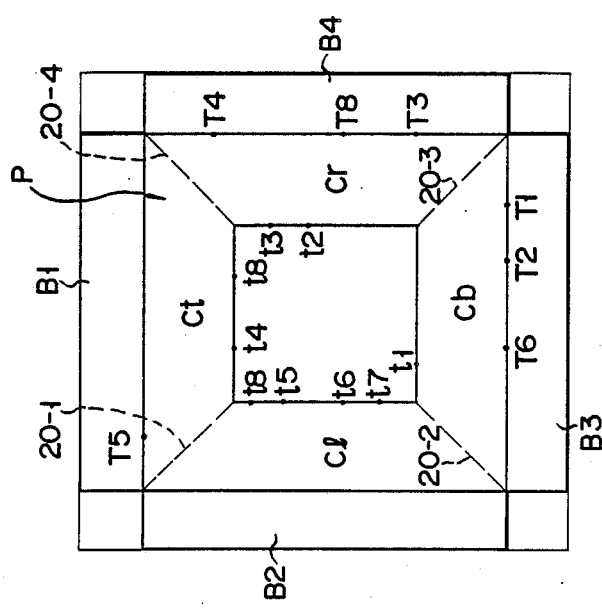

In FIGS. 7A to 7D, an example of a concrete wiring pattern obtained by applying the wiring processing technique of this invention to the peripheral channels is illustrated. FIG. 7A shows an example of the arrangement of connection terminals satisfying the requirement of connection between I/O blocks B1 to B4 and the internal wiring region containing the function blocks in square ring-form channel region P obtained at the stage of completion of the wiring process for the internal channels. In FIG. 7A, dots t1 to t8 marked on the four sides of the internal wiring region represent connection points of the internal wiring region, and dots T1 to T8 marked on the inner sides of I/O blocks B1 to B4 represent connection points of the I/O blocks. That is, the wiring process in square ring-form channel region P is effected in a manner that connection points t1 to t8 of the internal wiring region can be respectively connected to connection points T1 to T8 of the I/O blocks to which corresponding reference numerals are attached. For example, connection point t1 of the internal wiring region is connected to connection point T1 of the I/O block; connection point t2 is connected to connection point T2.

Figure 7B:
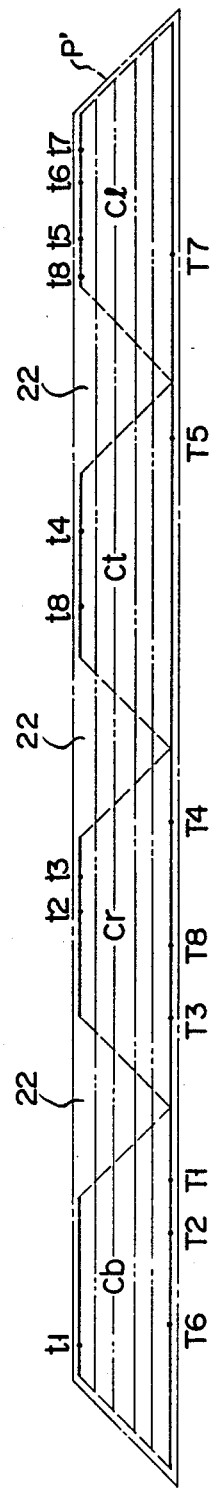

Square ring-form channel region P of FIG. 7A is cut off along oblique boundary 20-2, and is unidimensionally developed into belt-like channel region P' of FIG. 7B. At this time, auxiliary wiring regions 22 in an inverted triangle form are respectively added to portions corresponding to three other boundaries 20-1, 20-3 and 204 of belt-like channel region P' in FIG. 7A. In this condition, connection points t1 to t8 of the internal wiring region are linearly arranged with respect to the upper side of belt-like channel region P' as shown in FIG. 7B, and connection points T1 to T8 of the I/O blocks are linearly arranged with respect to the lower side of belt-like channel region P'. No connecting points are provided on the upper side portions in auxiliary regions 22 of channel region P'. In FIG. 7B, two-dot-dash lines indicate tracks along which trunks of the channel wiring extend.

Figure 7C:
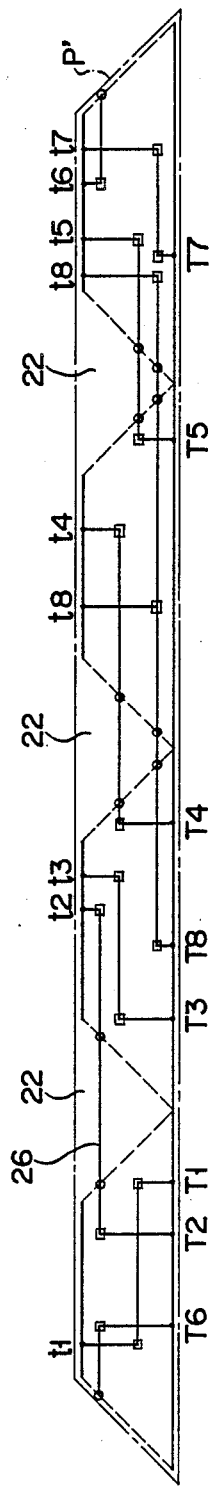

FIG. 7C shows the wiring pattern obtained after the wiring process for channel region P' is completed. The wiring process for channel region P' is effected in substantially the same manner as the normal channel wiring process described before except for the following points:

(1) it is inhibited that the trunks of the channel wiring vary in different tracks in auxiliary wiring regions 22; and (2) it is inhibited that the trunks intersect the vertical line segments in auxiliary wiring regions 22. In other words, only the trunks which extend straightly in the track direction in auxiliary wiring regions 22 are permitted to be allotted in auxiliary wiring regions 22. The wiring pattern of FIG. 7C is designed to satisfy the wiring limitation described above.

After this, the wiring pattern of FIG. 7C for belt-like channel region P' is modified to form a final wiring pattern of FIG. 7D so as to be suited to original square ring-form channel region P. As is clearly understood by visually comparing the wiring patterns of FIGS. 7C and 7D, auxiliary wiring regions 22 of belt-like channel region P' are omitted when belt-like channel region P' is restored to square ring-form channel region P. In this case, the linear trunk extending in each of auxiliary wiring regions 22 becomes a bending point of the wiring on the boundary in the corresponding corner portion of square ring-form channel region P. For example, trunk 26 straightly extending in auxiliary wiring region 22 arranged between sub-channels Cb and Cr becomes bending point 28 on boundary 20-3 in the right lower corner portion of square ring-form channel region P.

With the wiring method of this invention as described above, it is possible to effectively determine the wiring pattern satisfying the wiring requirement while the area of peripheral channels C1, C2, C5 and C6 arranged in contact with I/O blocks B1 to B4 is minimized. Since occurrence of dead space in peripheral channels C1, C2, C5 and C6, for example, dead space 18 as is shown in FIG. 4A can be effectively prevented, undesirable increase in the chip size of the LSI can be prevented so as to enhance the integration density to a maximum. FIG. 4B shows an example of the wiring pattern formed according to the wiring processing technique of this invention in such a manner as to be easily compared with the conventional wiring pattern of FIG. 4A. It will be easily understood by comparing the wiring patterns of FIGS. 4A and 4B that dead space 18 is omitted from the wiring pattern of this invention.

Although the invention has been described with reference to a specific embodiment, it shall be understood by those skilled in the art that numerous modification may be made that are within the spirit and scope of the inventive contribution.

What is claimed is:

1. An automatic wiring method for a semiconductor integrated circuit device in which function blocks selected to provide desired logic functions are arranged in the surface area of a substrate surrounded by input/output circuit blocks provided on the peripheral portion of said substrate and divided channels functioning as wiring regions are formed around said function blocks, said method comprising the steps of:
   (a) sequentially processing said channels for wiring in a predetermined processing order to form a channel wiring pattern by determining electrical connecting paths between said function blocks associated with a corresponding one of said channels sequentially selected to satisfy the requirement for the wiring in the selected channel;
   (b) completing the wiring process for internal channels among said channels except peripheral channels which are in direct contact with said input/output circuit blocks, and then merging said peripheral channels to form a rectangular ring-form channel region;
   (c) developing said ring-form channel region in a one-dimensional fashion to form a linear channel region;
   (d) processing said linear channel region for wiring to determine a wiring pattern for said linear channel region; and
   (e) reforming said wiring pattern to be suited for said ring-form channel region.

2. The method according to claim 1, wherein said ring-form channel region is cut off along oblique boundaries which are newly defined in corner edge portions thereof and developed to form said linear channel region.

3. The method according to claim 2, wherein auxiliary wiring regions are temporarily added to portions of said linear channel region which correspond to the corner edge portions of said ring-form channel region and are omitted when said linear channel region is restored to said ring-form channel region.

4. The method according to claim 3, wherein said linear channel region includes a plurality of parallel tracks and only those wirings which extend straightly in the track direction of said linear channel region in said auxiliary wiring regions are permitted to be allotted in said auxiliary wiring regions when said linear channel region is subjected to the wiring process.

5. The method according to claim 4, wherein said function blocks include at least one of an operation unit and a memory unit.

6. The method according to claim 5, wherein said memory unit includes at least one of a random access memory and a read only memory.

7. The method according to claim 5, wherein said operation unit includes at least one of a programmable logic array, an arithmetic logic unit and a central processing unit.

8. A computer-aided automatic wiring method for a semi-custom semiconductor integrated circuit device, comprising the steps of:
   (a) arranging function blocks and four input/output circuit blocks selected to provide desired logic functions on a square-shaped substrate, said input/output circuit blocks being positioned in the peripheral portion of said substrate and said function blocks being surrounded by said input/output circuit blocks;
   (b) dividing that substrate surface which is surrounded by said input/output circuit blocks and lies around said function blocks into a plurality of channels which have internal channels lying between said function blocks and peripheral channels located in direct contact with said input/output circuit blocks;
   (c) sequentially selecting one of said internal channels in predetermined wiring process order, and determining electrical connecting paths between said function blocks associated with the selected internal channel to satisfy the requirement for the wiring in the selected internal channel;
   (d) completing the wiring process for said internal channels, and then merging said peripheral channels to form a rectangular ring form channel region;
   (e) cutting off said ring-form channel region along oblique boundaries newly defined in corner edge portions thereof to develop said ring-form channel region in a one-dimensional fashion, thus forming a linear channel region;
   (f) processing said linear channel region for wiring to determine a wiring pattern for said linear channel region; and
   (g) reforming said wiring pattern to be suited for said ring-form channel region.

9. The method according to claim 8, wherein auxiliary wiring regions in a triangle form are temporarily formed in those portions of said linear channel region which corresponds to said oblique boundaries on said ring-form channel region, and a wiring in said auxiliary wiring region is inhibited from changing from one track to another.

10. The method according to claim 9, wherein said linear channel region has a first side on which connection points of the wiring pattern formed for said internal channels are arranged and a second side which is provided in opposition to said first side and on which connection points of said input/output circuit blocks are arranged.

* * * * *